(12) United States Patent
Meagley et al.

(10) Patent No.: US 7,678,527 B2
(45) Date of Patent: Mar. 16, 2010

(54) METHODS AND COMPOSITIONS FOR PROVIDING PHOTORESIST WITH IMPROVED PROPERTIES FOR CONTACTING LIQUIDS

(75) Inventors: Robert P Meagley, Hillsboro, OR (US);
Ernisse S Putna, Beaverton, OR (US);
Wang Yueh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/688,109

(22) Filed: Oct. 16, 2003

(65) Prior Publication Data
US 2005/0084794 A1  Apr. 21, 2005

(51) Int. Cl.
*G03F 7/00* (2006.01)
*G03F 7/004* (2006.01)
*G03F 7/20* (2006.01)

(52) U.S. Cl. .................. 430/270.1; 430/311; 430/396
(58) Field of Classification Search ............... 430/270.1
See application file for complete search history.

(56) References Cited

U.S. PATENT DOCUMENTS

| | | | |
|---|---|---|---|
| 6,316,159 B1 * | 11/2001 | Chang et al. ............ | 430/270.1 |
| 6,703,178 B2 * | 3/2004 | Chen et al. ................ | 430/170 |
| 6,809,794 B1 * | 10/2004 | Sewell ...................... | 355/30 |
| 2002/0160301 A1 * | 10/2002 | Lee et al. ................ | 430/270.1 |
| 2003/0036016 A1 * | 2/2003 | Szmanda et al. ........ | 430/270.1 |
| 2003/0077539 A1 * | 4/2003 | Lu et al. .................. | 430/270.1 |
| 2004/0009427 A1 * | 1/2004 | Takasu et al. ............ | 430/270.1 |
| 2004/0081914 A1 * | 4/2004 | Imai et al. ................ | 430/281.1 |
| 2004/0131973 A1 * | 7/2004 | Tao et al. .................. | 430/302 |

OTHER PUBLICATIONS

Prior Art Known To The Inventorship Entity, Attached, 1 page.

* cited by examiner

*Primary Examiner*—Amanda C. Walke

(57) ABSTRACT

Embodiments of the invention provide methods and compositions for providing photoresists with improved liquid-contact properties. For one embodiment of the invention, a photoresist is provided having one or more constituent components that are resistant to diffusion between the photoresist and an index-matching liquid (IML). For such an embodiment in which the IML is water, a photoresist component is provided that is hydrophobic thus reducing diffusion between the photoresist and the water. In various alternative embodiments of the invention, a photoresist is provided having one or more constituent components that encourage diffusion between the photoresist layer and the IML in such manner as to impart beneficial liquid-contact properties to the photoresist layer. For such an embodiment in which the IML is water, a photoresist is provided having one or more hydrophilic constituents.

30 Claims, 4 Drawing Sheets

METHODS AND COMPOSITIONS FOR PROVIDING PHOTORESIST WITH IMPROVED PROPERTIES FOR CONTACTING LIQUIDS

FIELD

Embodiments of the invention relate generally to the field of liquid immersion lithography processes for semiconductor manufacturing processes, and more specifically to photoresists having improved liquid-contact properties.

BACKGROUND

The manufacture of semiconductor devices typically includes a lithography process. Lithography typically involves various combinations of material deposition, etching, and chemical treatment.

A portion of a typical lithography process would proceed as follows. A film (e.g., a metal film) layer is deposited on a substrate. A photoresist layer is then deposited on the substrate (i.e., over the film layer). A photoresist is a photosensitive material that hardens when exposed to light. The photoresist may typically be spun onto the substrate and may include solvents to ensure a uniform coating. Such photoresists may be soft baked after deposition to drive off excess solvents. The photoresist is exposed to light in specific places to modify the solubility properties of the film only in the exposed regions. Typically, a mask (i.e., a transparent plate having a printed pattern) and a light source (scanner) are used to illuminate the specified portions of the photoresist layer. Typically, the wafer may then be postexposure baked and may then be developed to remove the exposed portion. Then the photoresist layer is etched using a chemical treatment. The exposed portions of the photoresist may be positive (i.e., rendered more susceptible to chemical etching) or negative (i.e., rendered less susceptible to chemical etching).

The scanner used to illuminate the specified portions of the photoresist layer is a type of camera that forms the desired image on the photoresist layer. The scanner has a number of optical elements in conjunction, used to project the image of the pattern from the mask. The image proceeds from the last optical element of the scanner. The last optical element is therefore in proximity to the wafer with an air gap between the last lens element and the substrate. The index of refraction of the air is different from the index of refraction of the lens, which may typically be quartz (e.g., silicon oxide) or a calcium fluorite crystal. This mismatch in the indices of refraction results in diffraction that limits the minimum size and image quality of the projected image.

One method of reducing mismatched indices between the last lens element and the photoresist, is to place a liquid on the photoresist layer in contact with both the photoresist layer and the last lens element. The liquid is selected to match the index of refraction of the last lens element at the incident wavelength and is, therefore, referred to as an index-matching liquid (IML). By eliminating the air gap and providing a matched index of refraction, the IML helps reduce the diffraction allowing a greater portion of the image information to proceed from the scanner into the photoresist layer, which allows the projection of an image of higher quality. The IML may be selected to provide the best index-matching properties for a given lithographic process. For example, if a 193 nm wavelength light is used to illuminate the photoresist layer, then a silicon-based lens may typically be used and water has a similar refractive index. For other illumination wavelengths, other types of lenses may be used and an alternative IML may be selected.

One major drawback of putting an IML on the photoresist layer is that IML may have a detrimental impact on the photoresist layer. For example, the liquid-contact properties of the photoresist are such that water in contact with the photoresist layer will diffuse into the photoresist layer. Moreover, constituents of the photoresist (e.g., photoactive compounds) will diffuse from the photoresist layer into the water and may thereby degrade the index-matching properties of the water and the imaging performance of the photoresist.

FIG. 1 illustrates the diffusion between an IML and a photoresist of an immersion lithography exposure system in accordance with the prior art. FIG. 1 includes a substrate 101 having a photoresist layer 102 deposited thereon. An IML 103 is disposed between the photoresist layer 102 and a last lens element 104 for illuminating the photoresist. Last lens element 104 is part of a scanner device (not shown). As shown by the arrows in FIG. 1, the IML 103 is diffusing into the photoresist layer 102 and constituents of the photoresist layer 102 are diffusing into the IML.

One known method of addressing the problem of the diffusion of the IML into the photoresist (or the diffusion of photoresist constituents into the IML), is to put a protective coating (topcoat) on the layer of photoresist that acts as a seal or shell to protect the photoresist. Such topcoats may prevent diffusion and may provide other beneficial properties (e.g., anti-reflective coating).

A serious drawback of putting a protective coating on the photoresist is that an additional process operation is required. This adds to production costs and production times, and lowers manufacturing throughput.

BRIEF DESCRIPTION OF THE DRAWINGS

The invention may be best understood by referring to the following description and accompanying drawings that are used to illustrate embodiments of the invention. In the drawings.

DETAILED DESCRIPTION

Overview

Figure 1:
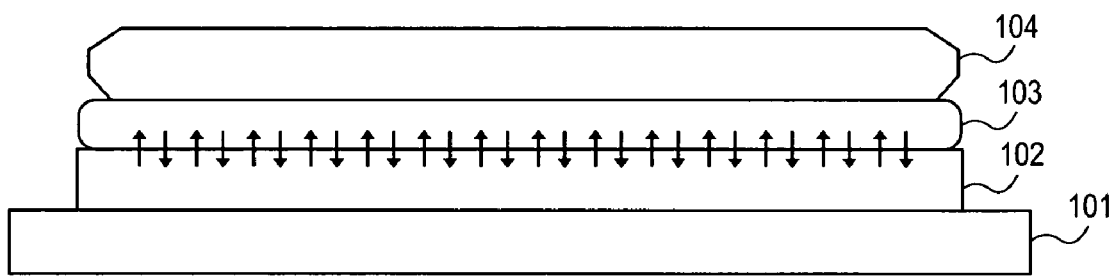
FIG. 1 illustrates the diffusion between an IML and a photoresist of an immersion lithography exposure system in accordance with the prior art.

Embodiments of the invention provide methods and compositions for providing photoresists with improved liquid-contact properties. For one embodiment of the invention, a photoresist is provided having one or more constituent components that are resistant to diffusion between the photoresist and the IML. For such an embodiment in which the IML is water, a photoresist component is provided that is hydrophobic thus reducing diffusion between the photoresist and the water. In various alternative embodiments of the invention, a photoresist is provided having one or more constituent components that encourage wetting between the photoresist layer and the IML in such manner as to impart beneficial liquid-contact properties to the photoresist layer. For such an embodiment in which the IML is water, a photoresist is provided having one or more hydrophilic constituents.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Chemically amplified photoresists typically include a number of constituents including: primers that react with acid to change their reactivity to etchant, surface-active agents (surfactants) to modulate surface tension, photo-acid generators (PAGs) to provide photosensitivity, dyes to modulate photoresist transparency, bases (quenchers) and acids to modulate the pH variation within the photoresist, plasticizers to modulate film properties, roughness, and adhesion promoters to increase adhesion of the photoresist to the wafer. These and other constituents are used in common photoresist chemistries.

In accordance with alternative embodiments of the invention, various types of these and other constituents may be added to the photoresist, alone or in combination to improve liquid contact properties and other properties of the photoresist vis-à-vis the ILM. Properties that such additives could impart to the photoresist include reduction of surface interaction between the photoresist and the ILM, the ability to form a protective layer between the ILM and underlying photoresist, and improved performance of the photoresist in regard to resolution, line width roughness, etc.

Process

Figure 2:
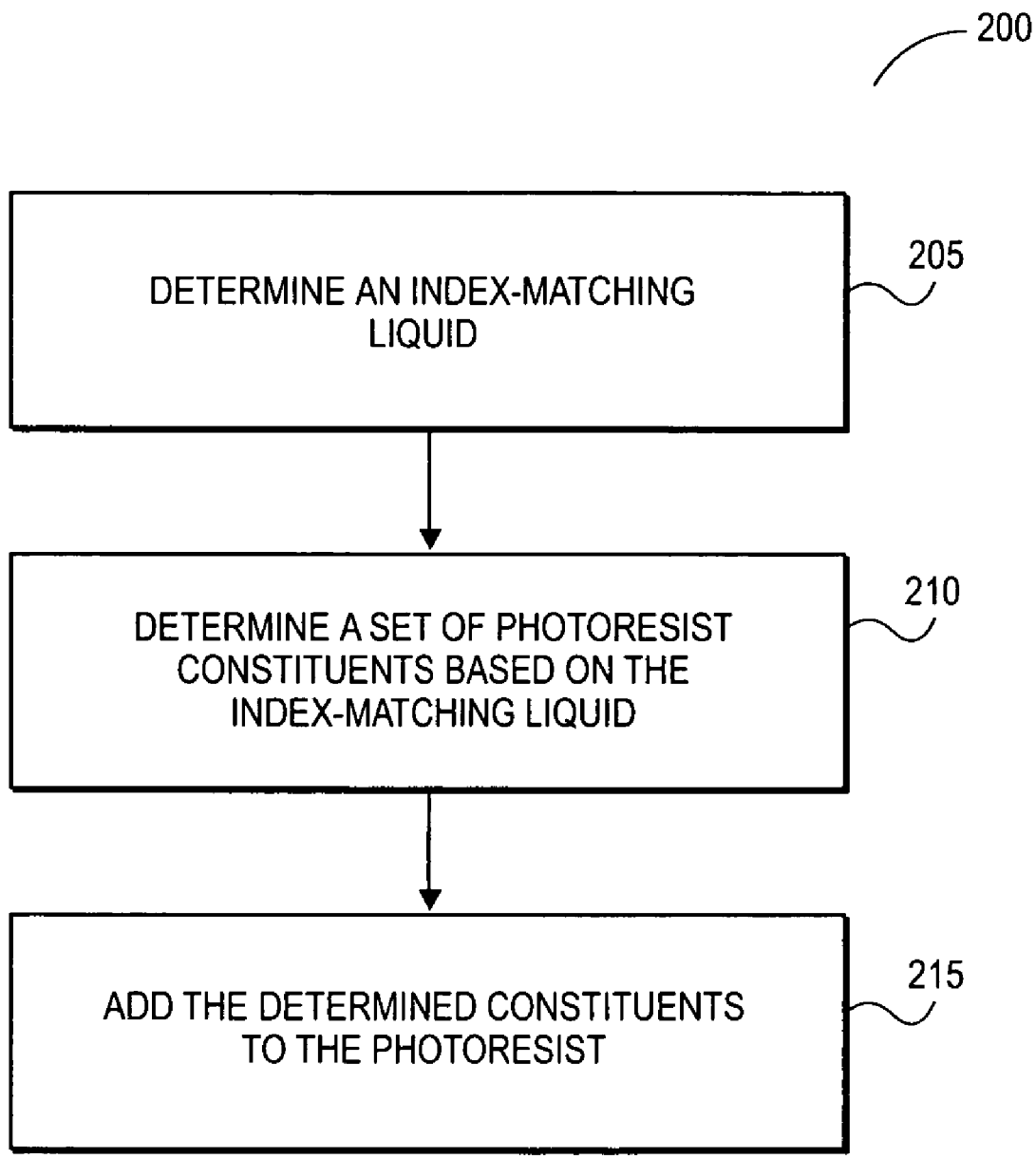
FIG. 2 illustrates a method for providing a photoresist having improved liquid-contact properties in accordance with one embodiment of the invention.

FIG. 2 illustrates a method for providing a photoresist having improved liquid-contact properties in accordance with one embodiment of the invention. Process 200, shown in FIG. 2, begins at operation 205 in which an IML is determined based upon the last lens element of the photolithographic scanner and upon the incident light wavelength. For one embodiment, water is selected for a system employing a silicon-based (e.g., silicon oxide) or a Calcium-fluoride ($CaF_2$)-based last lens element. Additionally, the last lens element may have, itself, been selected based upon the wavelength of the illumination light of the photolithographic process.

At operation 210, a set of one or more constituents are determined for addition to the photoresist. The set of constituents are determined to impart improved liquid-contact properties to the photoresist based upon the IML selected. The various constituents as well as the particular composition of each of the constituents are determined. For one embodiment, the photoresist, the set of constituents, and other parameters (e.g., constituent concentrations) of the photoresist chemistry are determined in consideration of the particular IML and, additionally, or alternatively, in consideration of the illumination light wavelength.

At operation 215, the determined constituents are added to the photoresist in the determined form and concentration.

For one embodiment, the determined constituents are determined such that solubility in the IML is reduced or eliminated. For alternative embodiments, the constituents are determined such that solubility in the IML is promoted.

Non-IML-Soluble

Many typical photoresist constituents of the prior art are soluble in typical IMLs. The diffusion of these constituents into the IML degrades the performance of the photoresist. For example, typical ionic PAGs (e.g., triphenyl sulfonium nonaflate) are water-soluble. The resultant reduction of the PAG in the photoresist due to diffusion into the IML (e.g., water) impedes the photo speed and leads to a non-uniform distribution of PAG through the thickness of the photoresist filter. In accordance with one embodiment of the invention, a non-water-soluble PAG is used as a constituent in the photoresist. For one such embodiment, the non-water-soluble PAG is a hydrophobic ionic PAG or a non-ionic PAG such as $R-SO_2-O-SO_2-R$ or $R-SO_3-NR$, where R is a conjugated (multiple double bonds) or non-conjugated ring. The use of such a PAG provides improved photo speed and imaging performance. In an alternative embodiment, a non-water-soluble PAG is used in conjunction with a water-soluble PAG to maintain performance while providing a level of PAG solubility, if desired.

Another example of a non-IML-soluble photoresist constituent to improve photoresist performance, is the addition of a non-water-soluble quencher (base) such as $R_3N$. Such a non-soluble quencher would neutralize the acid from the IML as it comes into contact with the photoresist (i.e., at the IML/photoresist layer interface). This would negate the detrimental effect of diffused acid in the IML.

Figure 3:
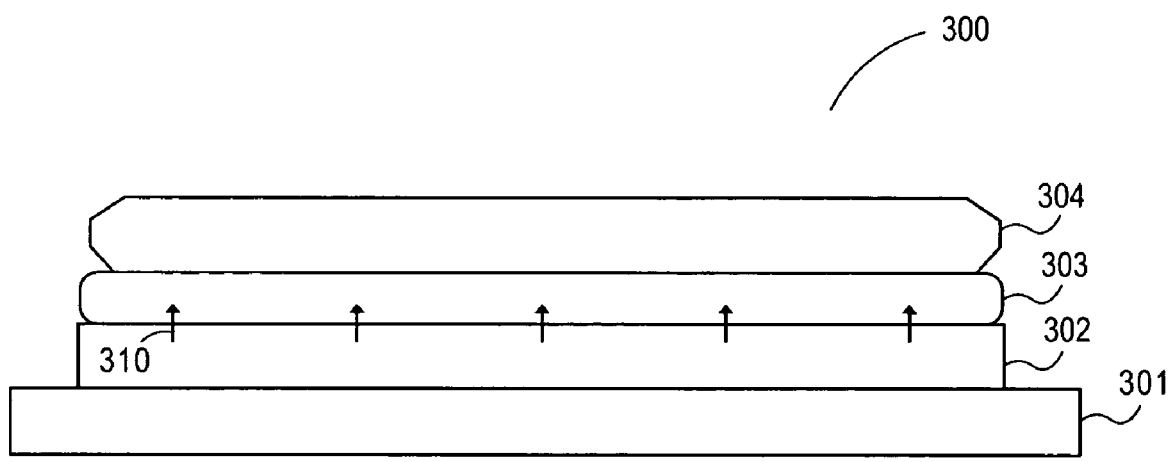
FIG. 3 illustrates the interaction between the photoresist and the ILM of an immersion lithography exposure system in accordance with one embodiment of the invention.

FIG. 3 illustrates the interaction between the photoresist and the ILM of an immersion lithography exposure system in accordance with one embodiment of the invention. Structure 300, shown in FIG. 3, includes a substrate 301 having a photoresist layer 302 deposited thereon. An IML 303 is disposed between the photoresist layer 302 and a last lens element 304 for illuminating the photoresist. The photoresist of photoresist layer 302 has additives incorporated therein that provide improved liquid-contact properties. For example, the photoresist has additives that are non-soluble in the IML 303. As shown by the arrows 310 in FIG. 3, some diffusion of the photoresist constituents (e.g., acid) is occurring. Diffusion of other non-IML-soluble constituents (e.g., PAGs, quenchers, etc.) is reduced or prevented, thus providing improved performance of the photoresist in accordance with various embodiments of the invention.

In alternative embodiments, where photoresist constituents are bound to the IML insoluble material to prevent their diffusion into the ILM, binding may be through a covalent bond, ionic pairing, or Van der Waal's interaction. This IML insoluble material may be a polymer, oligomer (low molecular weight polymer), or molecular species and may comprise reactivity with acid to modulate susceptibility to etch.

IML-Soluble

In accordance with alternative embodiments of the invention, constituents are added to the photoresist that are soluble in the IML. The diffusion of such IML-soluble constituents into IML can improve the performance of the photoresist. For example, as discussed above a non-water-soluble quencher could be used to neutralize acid upon contact with the photoresist. In an alternative embodiment, an IML-soluble quencher (e.g., as $R_4N^+OH^-$) could be used that would diffuse from the photoresist into the IML (e.g., water) to neutralize acid within the IML directly. Additionally, or alternatively, depending upon the strength of the acid, an IML-soluble buffer could be used in a similar manner.

In accordance with another embodiment of the invention, various IML-soluble constituents can be added to the photoresist to impart surface-layer properties to the photoresist. That is, when the selected constituent diffuses into the IML, it creates a concentration of the constituent in the IML that is in contact with the photoresist at the IML/photoresist layer interface. This contact may be used to impart beneficial properties to the photoresist such as surface inhibition, for example, for a surface-sensitive effect, which may be used to reduce sensitivity to contamination in the photoresist. The property of surface inhibition may also be used to reduce the detrimental impact of involuntary contacts (unintended contacts during the masking process).

For example, a hydrophilic surfactant may be used as a photoresist additive to directly modulate the IML/photoresist layer interface. Extraction and surface inhibition can be modulated in this manner. For one embodiment, a surfactant comprised of low-density, low molecular weight, components (e.g., a silicon-based or fluorocarbon-based) is used to form an inhibitory layer at the ILM/photoresist layer interface. The inhibitory layer protects the underlying photoresist layer in a similar manner to the topcoat of the prior art without the additional costs and processing operations. For such an embodiment, the surfactant or other additives may contain active functionality to improve imaging or development as noted above.

Another example of using an IML-soluble constituent to impart surface-layer properties to the photoresist, is the use of a hydrophilic plasticizer. The term plasticizers, as used here, refers to materials that not only alter the glass transition temperature, but alter the grain structure of the photoresist as well. In accordance with one embodiment of the invention, a hydrophilic plasticizer may be used to modulate the IML/photoresist layer by modifying various surface-layer properties of the photoresist (e.g., density, wet ability, and molecular organization). For such an embodiment, a cholate plasticizer, or other plasticizers that modify the density, glass transition, or nanotopology of the photoresist, may be used.

Figure 4:
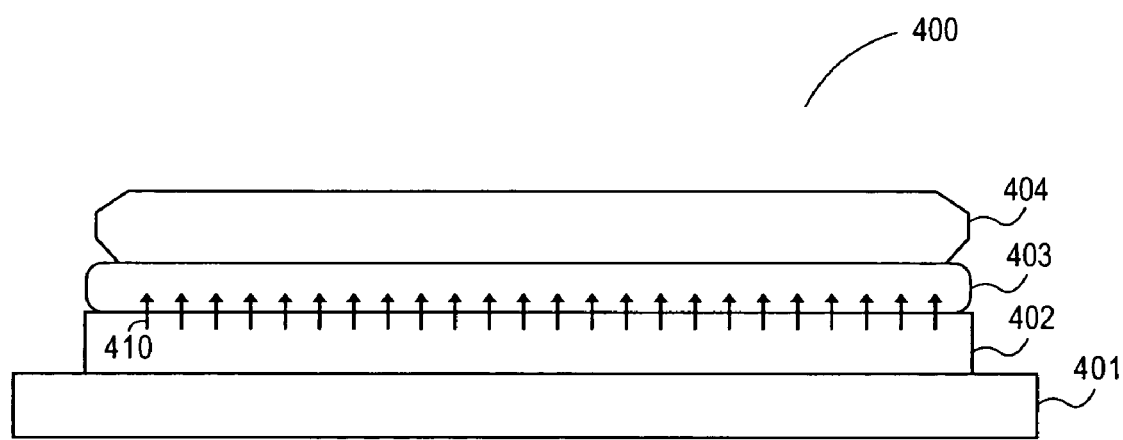
FIG. 4 illustrates the interaction between the photoresist and the ILM of an immersion lithography exposure system in accordance with one embodiment of the invention.

FIG. 4 illustrates the interaction between the photoresist and the ILM of an immersion lithography exposure system in accordance with one embodiment of the invention. Structure 400, shown in FIG. 4, includes a substrate 401 having a photoresist layer 402 deposited thereon. An IML 403 is disposed between the photoresist layer 402 and a last lens element 404 for illuminating the photoresist. The photoresist of photoresist layer 402 has additives incorporated therein that provide improved liquid-contact properties. For example, the photoresist has additives that are soluble in the IML 403. As shown by the arrows 410 in FIG. 4, diffusion of particular photoresist constituents (e.g., surfactant) into the IML 403 is promoted, thus providing improved performance of the photoresist in accordance with various embodiments of the invention.

General Matters

Embodiments of the invention provide photoresist with additives incorporated in the photoresist that reduce detrimental effects of interaction with an IML. In various alternative embodiments, the additives may improve the performance of the photoresist.

Various embodiments employ additives that are non-soluble in the IML, and therefore, reduce or prevent diffusion between the photoresist and the IML. Various other embodiments employ additives that are soluble in the IML, and therefore, promote diffusion between the photoresist and the IML. Still other various embodiments employ a combination of IML-non-soluble and IML-soluble additives.

Various examples of IML-non-soluble and ILM-soluble additives have been provided in the context of an immersion lithography exposure system employing water as an IML (e.g., a 193 nm wavelength illumination light and silicon-based lens system). For various embodiments, the IML is not restricted to water, but may be any suitable liquid.

Embodiments of the invention include various operations. Many of the methods are described in their most basic form, but operations can be added to or deleted from any of the methods without departing from the basic scope of the invention. For example, in reference to process 200, described above in reference to FIG. 2, operation 205 may be modified to selection of an IML based upon additional or alternative criterion, or may be omitted altogether for an embodiment where the IML is selected without regard to the composition of the last lens element or to the photoresist.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   providing a photolithographic scanner, said photolithographic scanner comprising a light source and a last lens element, said light source producing light having a wavelength, said last lens element having a refractive index;
   providing an index-matching liquid (IML) based on said wavelength and said refractive index;
   providing a photoresist, said photoresist comprising a combination of one or more IML-non-soluble additives and one or more IML-soluble-additives and other constituents wherein form and concentration are determined by properties of said IML;
   binding said other constituents of said photoresist to said IML-non-soluble additives;
   placing said IML in contact with both said last lens element and said photoresist;
   preventing diffusion of said IML-non-soluble additives and said other bound constituents into said IML;
   thus neutralizing acid diffusing from said IML into said photoresist;
   promoting diffusion of said IML-soluble-additives from said photoresist into said IML and creating a concentration of said IML-soluble additives in said IML;
   thus improving wettability and creating surface inhibition of surface layer of said photoresist; and illuminating said IML and said photoresist with said light from said last lens element.

2. The method of claim 1 wherein said combination of one or more IML-non-soluble additives and one or more IML-soluble-additives is based upon said IML.

3. The method of claim 1 wherein said IML comprises water.

4. The method of claim 1 wherein said one or more IML-non-soluble additives comprises at least one water-insoluble constituent.

5. The method of claim 4 wherein said at least one water-insoluble constituent is selected from a group consisting of a hydrophobic ionic photoacid generator and a non-ionic photoacid generator.

6. The method of claim 4 wherein said at least one water-insoluble constituent comprises a water-insoluble quencher.

7. The method of claim 4 wherein said at least one water-insoluble constituent comprises a water-insoluble polymer.

8. The method of claim 4 wherein water-soluble constituents are bound to said at least one water insoluble constituent via a binding method selected from a group consisting of covalent binding, ion pairing, and Van der Waal's forces.

9. The method of claim 4 wherein said at least one water-insoluble constituent may react when said photoresist is used to modulate susceptibility to etch.

10. The method of claim 1 wherein said one or more IML-soluble additives comprises at least one water-soluble constituent.

11. The method of claim 10 wherein said at least one water-soluble constituent is selected from a group consisting of a water-soluble photoacid generator, a water-soluble quencher, a water-soluble buffer, a water-soluble surfactant, and a water-soluble plasticizer.

12. The method of claim 11 wherein said water-soluble surfactant is a fluorocarbon-based surfactant.

13. An apparatus comprising:
a substrate;
a photoresist disposed in contact with said substrate;
an index-matching liquid (IML) disposed in contact with said photoresist; and
a last lens element disposed in contact with said IML, wherein said photoresist comprises a protective layer formed by one or more IML-non-soluble additives wherein said protective layer has reduced surface interaction in contact with said IML due to one or more IML-soluble-additives.

14. The apparatus of claim 13 wherein said one or more IML-soluble additives are specific to a particular IML.

15. The apparatus of claim 14 wherein said particular IML comprises water and said one or more IML-non-soluble additives comprises at least one hydrophobic additive.

16. The apparatus of claim 15 wherein said at least one hydrophobic additive comprises a non-ionic photoacid generator.

17. The apparatus of claim 15 wherein said at least one hydrophobic additive comprises a water-insoluble quencher.

18. The apparatus of claim 15 wherein said at least one hydrophobic additives comprises a water-insoluble polymer.

19. The apparatus of claim 15 wherein water-soluble constituents are bound to said at least one hydrophobic additive via a binding method selected from a group consisting of covalent binding, ion pairing, and Van der Waal's forces.

20. The apparatus of claim 15 wherein said at least one hydrophobic additive may react when said photoresist is used to modulate susceptibility to etch.

21. The apparatus of claim 14 wherein said particular IML comprises water and said one or more IML-soluble additives comprises at least one hydrophilic additive.

22. The apparatus of claim 21 wherein said at least one hydrophilic additive comprises a water-soluble quencher.

23. The apparatus of claim 21 wherein said at least one hydrophilic additive comprises a water-soluble buffer.

24. The apparatus of claim 21 wherein said at least one hydrophilic additive comprises a water-soluble surfactant.

25. The apparatus of claim 24 wherein said water-soluble surfactant comprises a fluorocarbon-based surfactant.

26. The apparatus of claim 21 wherein said at least one hydrophilic additive comprises a water-soluble plasticizer.

27. A system comprising:
a last lens element of a lithography exposure system, said last lens element having a specific index of refraction;
a specific index-matching liquid (IML) in contact with said last lens element, said specific IML having an index of refraction equal to said specific index of refraction to within a specified tolerance, said specific IML comprising one or more IML-soluble-additives to reduce surface interaction with a photoresist; and
said photoresist in contact with said specific IML, said photoresist comprising a protective layer formed from one or more IML-non-soluble additives to reduce surface interaction with said specific IML.

28. The system of claim 27 wherein said IML comprises water and said one or more IML-non-soluble additives comprises at least one water-insoluble constituent.

29. The system of claim 28 wherein said at least one water-insoluble constituent comprises a constituent selected from a group consisting of a non-ionic photoacid generator, a hydrophobic ionic photoacid generator, a quencher, a polymer, an oligomer, and a molecular species.

30. The system of claim 27 wherein said IML comprises water and said one or more IML-soluble-additives comprises at least one water-soluble constituent wherein said at least one water-soluble constituents comprises a constituent selected from a group consisting of a water-soluble photoacid generator, a water-soluble quencher, a water-soluble buffer, a water-soluble surfactant, and a water-soluble plasticizer.

\* \* \* \* \*